US011053382B2

(12) United States Patent
Takiguchi et al.

(10) Patent No.: US 11,053,382 B2
(45) Date of Patent: Jul. 6, 2021

(54) RESIN COMPOSITION, LAMINATE, SEMICONDUCTOR WAFER WITH RESIN COMPOSITION LAYER, SUBSTRATE FOR MOUNTING SEMICONDUCTOR WITH RESIN COMPOSITION LAYER, AND SEMICONDUCTOR DEVICE

(71) Applicant: MITSUBISHI GAS CHEMICAL COMPANY, INC., Tokyo (JP)

(72) Inventors: Takenori Takiguchi, Tokyo (JP); Kohei Higashiguchi, Tokyo (JP); Tsuyoshi Kida, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 0 days.

(21) Appl. No.: 16/304,926

(22) PCT Filed: May 29, 2017

(86) PCT No.: PCT/JP2017/019906
§ 371 (c)(1),
(2) Date: Nov. 27, 2018

(87) PCT Pub. No.: WO2017/209044
PCT Pub. Date: Dec. 7, 2017

(65) Prior Publication Data
US 2019/0276657 A1 Sep. 12, 2019

(30) Foreign Application Priority Data

May 31, 2016 (JP) .............................. JP2016-108170
Jul. 14, 2016 (JP) .............................. JP2016-139704

(51) Int. Cl.
| | | |
|---|---|---|
| *H01L 29/08* | (2006.01) |
| *C08L 39/04* | (2006.01) |
| *C08K 3/013* | (2018.01) |
| *C08K 3/22* | (2006.01) |
| *C08K 3/28* | (2006.01) |
| *C08L 33/08* | (2006.01) |
| *H01L 23/29* | (2006.01) |
| *H01L 23/31* | (2006.01) |
| *C08K 5/1539* | (2006.01) |
| *C08K 5/52* | (2006.01) |
| *C08K 3/00* | (2018.01) |
| *C08L 39/00* | (2006.01) |
| *C08K 5/42* | (2006.01) |
| *C08K 5/09* | (2006.01) |
| *C08K 5/13* | (2006.01) |

(52) U.S. Cl.
CPC .............. *C08L 39/04* (2013.01); *C08K 3/00* (2013.01); *C08K 3/013* (2018.01); *C08K 3/22* (2013.01); *C08K 3/28* (2013.01); *C08K 5/1539* (2013.01); *C08K 5/42* (2013.01); *C08K 5/52* (2013.01); *C08L 33/08* (2013.01); *C08L 39/00* (2013.01); *H01L 23/29* (2013.01); *H01L 23/295* (2013.01); *H01L 23/31* (2013.01); *C08K 5/09* (2013.01); *C08K 5/13* (2013.01); *C08K 2003/222* (2013.01); *C08K 2003/2224* (2013.01); *C08K 2003/2227* (2013.01); *C08K 2003/282* (2013.01)

(58) Field of Classification Search
CPC .......... C08L 39/04; C08K 3/013; C08K 3/00; C08K 5/1539; H01L 23/31
USPC .................................................. 257/789, 40
See application file for complete search history.

(56) References Cited

U.S. PATENT DOCUMENTS

| | | | | |
|---|---|---|---|---|
| 5,358,992 A * | 10/1994 | Dershem | ............ | C08G 73/0655 252/511 |
| 5,489,641 A * | 2/1996 | Dershem | ............ | C08G 73/0655 252/511 |
| 5,605,763 A * | 2/1997 | Yusa | .......................... | C08J 5/18 156/306.6 |
| 2003/0008992 A1* | 1/2003 | Dershem | ............... | C08F 232/08 526/258 |
| 2006/0116476 A1* | 6/2006 | Cheng | ................... | C08F 222/40 525/120 |
| 2013/0237018 A1 | 9/2013 | Dilao et al. | | |
| 2014/0187729 A1 | 7/2014 | Horiguchi et al. | | |
| 2014/0242757 A1 | 8/2014 | Yoko et al. | | |
| 2016/0340557 A1 | 11/2016 | Bai et al. | | |
| 2017/0012022 A1* | 1/2017 | Yoshida | .................. | G03F 7/033 |

FOREIGN PATENT DOCUMENTS

| | | |
|---|---|---|
| CN | 103328577 | 9/2013 |
| EP | 2666825 | 11/2013 |
| EP | 3466992 | 4/2019 |
| EP | 3467038 | 4/2019 |
| JP | 2013-110422 | 6/2013 |
| JP | 2013-112730 | 6/2013 |
| JP | 5422878 | 2/2014 |
| JP | 2015-503220 | 1/2015 |
| JP | 2015-172145 | 10/2015 |
| JP | 2016-27174 | 2/2016 |
| JP | 2016065146 | 4/2016 |
| TW | 201542690 | 11/2015 |
| WO | 2013/035205 | 3/2013 |
| WO | 2015/127179 | 8/2015 |

OTHER PUBLICATIONS

International Search Report in International Application No. PCT/JP2017/019906, dated Jul. 4, 2017.

* cited by examiner

*Primary Examiner* — Caleb E Henry
(74) *Attorney, Agent, or Firm* — Greenblum & Bernstein, P.L.C.

(57) ABSTRACT

The present invention provides a resin composition containing a maleimide compound (A), and at least one selected from the group consisting of an organic compound (B) having an acidic site and an organic compound (C) having an acid anhydride site.

22 Claims, No Drawings

RESIN COMPOSITION, LAMINATE, SEMICONDUCTOR WAFER WITH RESIN COMPOSITION LAYER, SUBSTRATE FOR MOUNTING SEMICONDUCTOR WITH RESIN COMPOSITION LAYER, AND SEMICONDUCTOR DEVICE

TECHNICAL FIELD

The present invention relates to a resin composition useful as an underfill material, a laminate using such a resin composition, a semiconductor wafer with a resin composition layer, a substrate for mounting a semiconductor with a resin composition layer, and a semiconductor device produced by using the resin composition of the present invention.

BACKGROUND ART

In recent years, in accordance with downsizing and improvement in performance of semiconductor devices, flip-chip bonding is attracting attention as a method for mounting a semiconductor chip (hereinafter sometimes abbreviated as a "chip") on a substrate for mounting a semiconductor (hereinafter sometimes abbreviated as "substrate"). In the flip-chip bonding, a method in which a chip and a substrate are connected to each other, and an underfill material filled in a gap between the chip and the substrate is cured is generally employed. In accordance with downsizing and improvement in performance of semiconductor devices, however, a pitch between electrodes arranged on a chip and a gap between electrodes are reduced, and thus, workability degrades due to elongated time required for filling an underfill material, and filling failure such as insufficient filling occurs, which is problematic. In order to deal with the problem, a method in which the connection between a chip and a substrate and the filling of an underfill material are simultaneously performed after supplying a pre-applied underfill material to the chip or the substrate is being examined.

When a chip and a substrate are bonded to each other through a metal that can be easily oxidized, such as solder or copper, a flux component derived from carboxylic acid or the like is added to a pre-applied underfill material in some cases for purposes of obtaining good metal bonding by removing, from a connecting portion, a metal oxide film otherwise causing a bonding failure.

Patent Document 1 describes a pre-applied underfill material using an epoxy compound. Patent Document 2 also describes a pre-applied underfill material using an epoxy compound.

Patent Document 3 describes a pre-applied underfill material using an epoxy compound and a flux component. In addition, Patent Document 4 describes an underfill material using an acrylic monomer. Furthermore, Patent Document 5 describes a pre-applied underfill material using a radically polymerizable monomer.

CITATION LIST

Patent Document

Patent Document 1: Japanese Patent No. 5422878
Patent Document 2: Japanese Patent Application Laid-Open No. 2016-027174
Patent Document 3: Japanese Patent Application Laid-Open No. 2013-112730
Patent Document 4: Japanese Patent Application Laid-Open No. 2015-172145
Patent Document 5: National Publication of International Patent Application No. 2015-503220

SUMMARY OF INVENTION

Technical Problem

In a pre-applied underfill material using an epoxy compound as described in Patent Documents 1 and 2, the epoxy compound has advantages of high adhesiveness to various materials and an excellent electrical insulating property. However, such a pre-applied underfill material does not intentionally contain a flux component. In other words, a flux component reacts with an epoxy compound, and thus sufficient flux activity for obtaining good metal bonding cannot be disadvantageously obtained, and therefore, a flux component cannot be used in a resin composition using an epoxy compound. Accordingly, it is difficult to remove an oxidized layer of a connecting portion in using the pre-applied underfill material described in Patent Documents 1 and 2.

In Patent Document 3, a specific carboxyl-group containing compound is used as a flux component. A reaction of the carboxyl-group containing compound with an epoxy compound slightly proceeds, however, even at room temperature, and thus flux activity is lowered over time during storage, and therefore, connection stability is disadvantageously low and mass productivity is disadvantageously poor. Furthermore, also in Patent Document 4, since a flux component is not contained intentionally, an oxidized layer of a connecting portion cannot be removed before metal bonding.

In Patent Document 5, a thermal radical initiator is used as a polymerization initiator of the radically polymerizable monomer. The thermal radical initiator is, however, an unstable compound, and has a disadvantage of poor product life of a resin composition. In addition, although a polymer containing a carboxyl group is used in Patent Document 5, the polymer has such a high molecular weight that mobility of a carboxyl group is low, and thus sufficient flux activity cannot be expected.

The present invention has been made in consideration of the above-described problems, and an object is to provide a resin composition for an underfill material that has excellent flux activity, a laminate, a semiconductor wafer with a resin composition layer, a substrate for mounting a semiconductor with a resin composition layer, and a semiconductor device.

Solution to Problem

The present inventors have conducted diligent studies for solving the above-described problems, and as a result, it was found that a resin composition containing a maleimide compound (A), and at least one selected from the group consisting of an organic compound (B) having an acidic site and an organic compound (C) having an acid anhydride site can solve the above-described problems, and thus, the present invention has been completed.

Specifically, the present invention is as described below:
[1] A resin composition for an underfill material, comprising a maleimide compound (A), and at least one selected from the group consisting of an organic compound (B) having an acidic site and an organic compound (C) having an acid anhydride site.

[2] The resin composition according to [1], wherein the maleimide compound (A) comprises at least one selected from the group consisting of 2,2-bis{4-(4-maleimidophenoxy)phenyl}propane, 1,2-bis(maleimido)ethane, 1,4-bis(maleimido)butane, 1,6-bis(maleimido)hexane, N,N'-1,3-phenylenedimaleimide, N,N'-1,4-phenylenedimaleimide, N-phenylmaleimide, a maleimide compound represented by the following formula (1), a maleimide compound represented by the following formula (2), and a maleimide compound represented by the following formula (3):

(1)

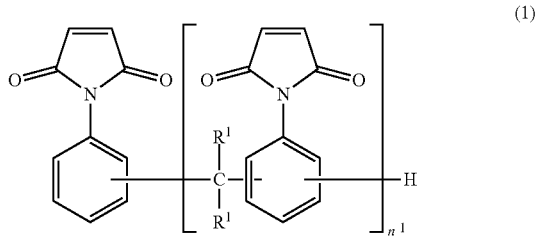

wherein $R^1$ each independently represents a hydrogen atom or a methyl group, and $n^1$ represents an integer of 1 or more;

(2)

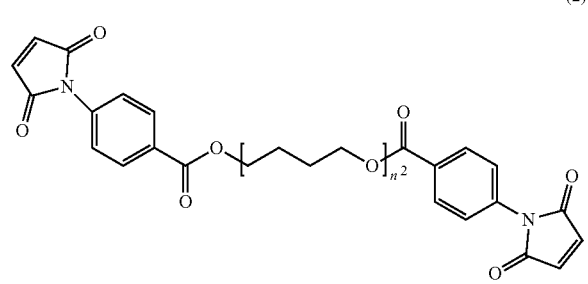

wherein $n^2$ represents a value of 1 or more and 30 or less on average;

(3)

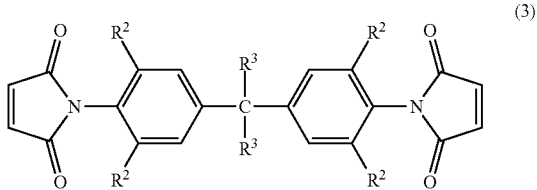

wherein $R^2$ each independently represents a hydrogen atom, a methyl group or an ethyl group, and $R^3$ each independently represents a hydrogen atom or a methyl group.

[3] The resin composition according to [1] or [2], wherein the maleimide compound (A) comprises at least one maleimide compound selected from the group consisting of 2,2-bis{4-(4-maleimidophenoxy)phenyl}propane, the maleimide compound represented by formula (1), the maleimide compound represented by formula (2), and the maleimide compound represented by formula (3).

[4] The resin composition according to any one of [1] to [3], in which a content, in the resin composition, of the organic compound (B) having an acidic site and the organic compound (C) having an acid anhydride site is 5 parts by mass or more and 50 parts by mass or less based on 100 parts by mass of a content of the maleimide compound (A).

[5] The resin composition according to any one of [1] to [4], in which the organic compound (B) having an acidic site has at least one functional group selected from the group consisting of a phosphate group, a carboxyl group and a sulfonate group.

[6] The resin composition according to any one of [1] to [5], in which the organic compound (B) having an acidic site has a molecular weight of 200 or more and 8000 or less.

[7] The resin composition according to any one of [1] to [6], in which the organic compound (B) having an acidic site comprises at least one selected from the group consisting of abietic acid, neoabietic acid, dehydroabietic acid, pimaric acid, isopimaric acid, palustric acid, dihydroabietic acid, tetrahydroabietic acid and an acid-modified rosin resin.

[8] The resin composition according to [7], in which the organic compound (B) having an acidic site comprises at least one selected from the group consisting of dehydroabietic acid, tetrahydroabietic acid and an acid-modified rosin resin.

[9] The resin composition according to any one of [1] to [8], in which an acid anhydride site of the organic compound (C) having an acid anhydride site is a carboxylic anhydride site.

[10] The resin composition according to any one of [1] to [9], further comprising an inorganic filler (D).

[11] The resin composition according to [10], in which the inorganic filler (D) has an electrical insulating property.

[12] The resin composition according to [10] or [11], wherein the inorganic filler (D) comprises at least one selected from the group consisting of silica, aluminum hydroxide, alumina, boehmite, boron nitride, aluminum nitride, magnesium oxide and magnesium hydroxide.

[13] The resin composition according to any one of [10] to [12], in which the inorganic filler (D) has an average particle size of 3 μm or less.

[14] The resin composition according to any one of [10] to [13], in which a content of the inorganic filler (D) is 300 parts by mass or less based on 100 parts by mass of a total content of the maleimide compound (A), the organic compound (B) having an acidic site and the organic compound (C) having an acid anhydride site.

[15] The resin composition according to any one of [1] to [14], further comprising a flexibility-imparting component (E).

[16] The resin composition according to [15], in which the flexibility-imparting component (E) comprises a thermoplastic polymer compound, and the polymer compound has a weight average molecular weight of 1000 or more and 1000000 or less.

[17] The resin composition according to [15] or [16], in which the flexibility-imparting component (E) comprises at least one selected from the group consisting of a (meth)acrylic oligomer and a (meth)acrylic polymer.

[18] The resin composition according to any one of [1] to [17], for use in a pre-applied underfill material.

[19] A laminate, including: a supporting material; and a layer comprising the resin composition according to any one of [1] to [18] stacked on the supporting material.

[20] A semiconductor wafer with a resin composition layer, including: a semiconductor wafer; and the layer comprising the resin composition of the laminate according to [19] stacked on the semiconductor wafer.

[21] A substrate for mounting a semiconductor with a resin composition layer, including: a substrate for mounting a semiconductor; and the layer comprising the resin composition of the laminate according to [19] stacked on the substrate for mounting a semiconductor.

[22] A semiconductor device, including: the semiconductor wafer with a resin composition layer according to [19]; and/or the substrate for mounting a semiconductor with a resin composition layer according to [18].

Advantageous Effects of Invention

The present invention can provide a resin composition for an underfill material having excellent flux activity, a laminate, a semiconductor wafer with a resin composition layer, a substrate for mounting a semiconductor with a resin composition layer, and a semiconductor device.

DESCRIPTION OF EMBODIMENT

An embodiment for carrying out the present invention (hereinafter simply referred to as the "present embodiment") will be hereinafter described in detail. It is noted that the following present embodiment is merely an example and the present invention is not limited to the present embodiment.

According to one aspect of the present embodiment, a resin composition for an underfill material, and preferably for a pre-applied underfill material contains a maleimide compound (A), and at least one selected from the group consisting of an organic compound (B) having an acidic site and an organic compound (C) having an acid anhydride site.

In addition, a resin composition according to another aspect of the present embodiment is a resin composition further containing an inorganic filler (D) in addition to the above-described components.

Furthermore, a resin composition according to still another aspect of the present embodiment is a resin composition further containing a flexibility-imparting component (E) in addition to the above-described components.

In still another aspect of the present embodiment, a laminate obtained by using the resin composition of the present embodiment (hereinafter also referred to as the "resin laminate"), a semiconductor wafer with a resin composition layer produced by using the laminate, a substrate for mounting a semiconductor with a resin composition layer produced by using the laminate, and a semiconductor device produced by using the resin composition of the present embodiment are also provided.

[I. Resin Composition]

The resin composition of the present embodiment is a resin composition suitably used as an underfill material to be used in flip-chip bonding of a chip. The resin composition contains the maleimide compound (A), and the organic compound (B) having an acidic site and/or the organic compound (C) having an acid anhydride site. The resin composition of the present embodiment may further contain the inorganic filler (D) and/or the flexibility-imparting component (E).

[I-1. Maleimide Compound (A)]

The maleimide compound (A) of the resin composition of the present embodiment is not especially limited as long as it is a compound having one or more maleimide groups in a molecule. Specific examples thereof include N-phenylmaleimide, N-hydroxyphenylmaleimide, bis(4-maleimidophenyl)methane, 4,4-diphenylmethane bismaleimide, bis(3,5-dimethyl-4-maleimidophenyl)methane, bis(3-ethyl-5-methyl-4-maleimidophenyl)methane, bis(3,5-diethyl-4-maleimidophenyl)methane, phenylmethane maleimide, o-phenylene bismaleimide, m-phenylene bismaleimide, p-phenylene bismaleimide, o-phenylene biscitraconimide, m-phenylene biscitraconimide, p-phenylene biscitraconimide, 2,2-bis(4-(4-maleimidophenoxy)-phenyl)propane, 3,3-dimethyl-5,5-diethyl-4,4-diphenylmethane bismaleimide, 4-methyl-1,3-phenylene bismaleimide, 1,6-bismaleimido-(2,2,4-trimethyl)hexane, 4,4-diphenylether bismaleimide, 4,4-diphenylsulfone bismaleimide, 1,3-bis(3-maleimidophenoxy)benzene, 1,3-bis(4-maleimidophenoxy)benzene, 4,4-diphenylmethane biscitraconimide, 2,2-bis[4-(4-citraconimidophenoxy)phenyl]propane, bis(3,5-dimethyl-4-citraconimidophenyl)methane, bis(3-ethyl-5-methyl-4-citraconimidophenyl)methane, bis(3,5-diethyl-4-citraconimidophenyl)methane, polyphenylmethane maleimide, a novolac-type maleimide compound, a biphenylaralkyl-type maleimide compound, 2,2-bis{4-(4-maleimidophenoxy)phenyl}propane, 1,2-bis(maleimido)ethane, 1,4-bis(maleimido)butane, 1,6-bis(maleimido)hexane, N,N'-1,3-phenylenedimaleimide, N,N'-1,4-phenylenedimaleimide, N-phenylmaleimide, a maleimide compound represented by the following formula (1), a maleimide compound represented by the following formula (2), and a maleimide compound represented by the following formula (3). One of these compounds can be used singly, or two or more of these compounds can be used as an appropriate mixture.

Among these, from the viewpoint of solubility in an organic solvent, 2,2-bis{4-(4-maleimidophenoxy)phenyl}propane, 1,2-bis(maleimido)ethane, 1,4-bis(maleimido)butane, 1,6-bis(maleimido)hexane, N,N'-1,3-phenylenedimaleimide, N,N'-1,4-phenylenedimaleimide, N-phenylmaleimide, a maleimide compound represented by the following formula (1), a maleimide compound represented by the following formula (2) and a maleimide compound represented by the following formula (3) are preferred, and 2,2-bis{4-(4-maleimidophenoxy)phenyl}propane, a maleimide compound represented by the following formula (1), a maleimide compound represented by the following formula (2) and a maleimide compound represented by the following formula (3) are more preferred. As a maleimide compound represented by the following formula (3), bis(3-ethyl-5-methyl-4-maleimidophenyl)methane is preferred.

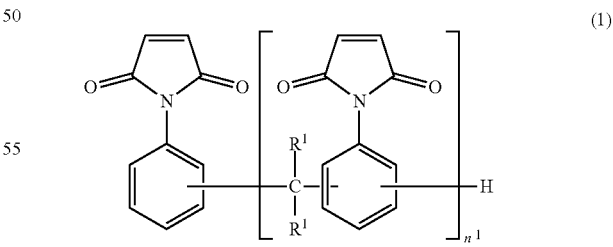

(1)

In formula (1), $R^1$ each independently represents a hydrogen atom or a methyl group, and is preferably a hydrogen atom from the viewpoint of more effectively and reliably obtaining the function effect of the present invention. In addition, in formula (1), $n^1$ represents an integer of 1 or more, and an upper limit of $n^1$ is usually 10, and is preferably 7 from the viewpoint of solubility in an organic solvent.

(2)

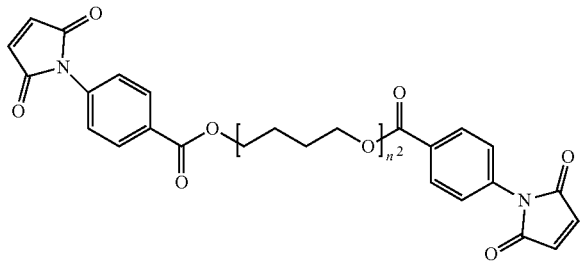

In formula (2), $n^2$ represents a value of 1 or more and 30 or less on average. From the viewpoint of more effectively and reliably obtaining the function effect of the present invention, $n^2$ is preferably a value of 7 or more and 30 or less, and more preferably a value of 7 or more and 18 or less on average.

(3)

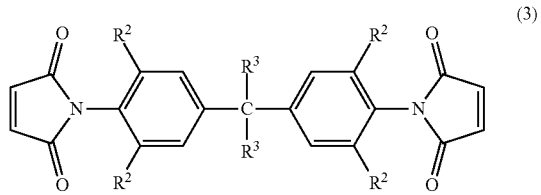

In formula (3), $R^2$ each independently represents a hydrogen atom, a methyl group or an ethyl group.

In formula (3), $R^3$ each independently represents a hydrogen atom or a methyl group.

In addition, from the viewpoint of the solubility in an organic solvent and flexibility, it is more preferable that the maleimide compound (A) of the present embodiment contains a maleimide compound represented by formula (2) as an essential component and contains at least one maleimide compound selected from the group consisting of 2,2-bis{4-(4-maleimidophenoxy)phenyl}propane, a maleimide compound represented by formula (1) and a maleimide compound represented by formula (3).

From the viewpoint of obtaining excellent flux activity, and excellent flexibility and a low coefficient of thermal expansion in a well-balanced manner, the maleimide compound (A) of the resin composition of the present embodiment preferably contains 5 parts by mass or more and 60 parts by mass or less of the maleimide compound represented by formula (2), preferably contains 5 parts by mass or more and 90 parts by mass or less of the maleimide compound represented by formula (1), and preferably contains 0 part by mass or more and 50 parts by mass or less of the maleimide compound represented by formula (3), and preferably contains 0 part by mass or more and 50 parts by mass or less of 2,2-bis{4-(4-maleimidophenoxy)phenyl}propane based on 100 parts by mass of a total amount of the maleimide compound (A).

The maleimide compound (A) can be contained in the resin composition in the form of a prepolymer obtained by polymerizing a maleimide compound, a prepolymer obtained by polymerizing a maleimide compound with another compound such as an amine compound, or the like. One of these compounds can be used singly or two or more of these compounds can be used as an appropriate mixture.

[I-2. Organic Compound (B) Having Acidic Site]

The organic compound (B) having an acidic site of the resin composition of the present embodiment is a component mainly concerned in the flux activity of the resin composition. The organic compound (B) having an acidic site is not especially limited as long as it is an organic compound having one or more acidic sites in a molecule. From the viewpoint of more effectively and reliably obtaining the function effect of the present invention, the acidic site is preferably, but not limited to, a phosphate group, a carboxyl group or a sulfonate group. Among these, a carboxyl group is more preferred, and a secondary carboxyl group or a tertiary carboxyl group is particularly preferred as the acidic site of the organic compound (B) having an acidic site from the viewpoint of more effectively preventing migration and corrosion of a metal such as solder or copper constituting a connecting portion in a semiconductor device in which the resin composition of the present embodiment is used as an underfill material, and preferably as a pre-applied underfill material.

In addition, the organic compound (B) having an acidic site of the resin composition of the present embodiment preferably prevents volatilization thereof before exhibiting the flux activity in the flip-chip bonding, namely, prevents volatilization of the organic compound (B) having an acidic site before removing an oxidized layer of the connecting portion. From this point of view, a molecular weight of the organic compound (B) having an acidic site is preferably 200 or more. On the other hand, from the viewpoint of obtaining mobility as an acid and attaining more sufficient flux activity, the molecular weight of the organic compound (B) having an acidic site is preferably 8000 or less, more preferably 5000 or less, further preferably 3000 or less, further preferably less than 2000, still further preferably 1500 or less, still further preferably 1000 or less, particularly preferably 800 or less, and extremely preferably 500 or less. In addition, the molecular weight of the organic compound (B) having an acidic site is not especially limited but is preferably 200 or more from the viewpoint of more effectively and reliably obtaining the function effect of the present invention. Furthermore, from the viewpoint of more sufficiently removing the oxidized layer of the connecting portion, a functional group equivalent of the acidic site is preferably 10000 g/eq. or less, more preferably 5000 g/eq. or less, further preferably 3000 g/eq. or less, still further preferably 1500 g/eq. or less, particularly preferably 1000 g/eq. or less, and extremely preferably 500 g/eq. or less. On the other hand, from the viewpoint of more effectively and reliably obtaining the function effect of the present invention, the functional group equivalent of the acidic site is preferably 100 g/eq. or more.

Specific examples of the organic compound (B) having an acidic site include abietic acid, neoabietic acid, dehydroabietic acid, pimaric acid, isopimaric acid, palustric acid, dihydroabietic acid, tetrahydroabietic acid, rosin acid (rosin) such as sandaracopimaric acid, and an acid-modified rosin resin. One of these can be used singly, or two or more of these compounds can be used as an appropriate mixture. Among these, from the viewpoint of sufficiently preventing deactivation otherwise caused by the maleimide compound (A), the organic compound (B) having an acidic site is preferably at least one selected from the group consisting of abietic acid, neoabietic acid, dehydroabietic acid, pimaric acid, isopimaric acid, palustric acid, dihydroabietic acid, tetrahydroabietic acid and an acid-modified rosin resin, is more preferably at least one selected from the group consisting of abietic acid, dihydroabietic acid, dehydroabietic acid, tetrahydroabietic acid and an acid-modified rosin resin, and is further preferably at least one selected from the group consisting of dehydroabietic acid, tetrahydroabietic acid and an acid-modified rosin resin. Particularly, dehydroabietic acid, tetrahydroabietic acid and an acid-modified rosin resin do not have a highly reactive non-aromatic carbon-carbon unsaturated bond and thus is minimally reactive with the maleimide compound (A). Therefore, sufficient flux activity necessary for removing the oxidized layer is more satisfactorily retained, and thus, a resin composition containing such a compound is more excellent in the flux activity. As the organic compound (B) having an acidic site, a commercially available product can be used, and examples of a commercially available organic compound (B) having an acidic site include abietic acid, dehydroabietic acid and dihydroabietic acid produced by Wako Pure Chemical Industries Ltd.

As the organic compound (B) having an acidic site, an acid-modified rosin resin can be used as described above. An acid-modified rosin resin is obtained by modifying a rosin with an organic acid. The organic acid used for modifying a rosin may be, for example, carboxylic acid, and more specifically, may be monocarboxylic acid or dicarboxylic acid having 2 to 12 carbon atoms. Examples of such an organic acid include acrylic acid, maleic acid and phthalic acid. As the acid-modified rosin resin, a commercially available product may be used, and an example includes Malkyd No. 32 manufactured by Arakawa Chemical Industries, Ltd.

A content of the organic compound (B) having an acidic site and the organic compound (C) having an acid anhydride site described later in the resin composition of the present embodiment is not limited, and is preferably 5 parts by mass or more and 50 parts by mass or less, and more preferably 10 parts by mass or more and 40 parts by mass or less based on 100 parts by mass of the maleimide compound (A). When the content of the organic compound (B) having an acidic site falls within the above-described range, the flux activity of the resin composition and the flexibility, that is, one of significant properties in usage for forming a resin laminate, can be both attained in a well-balanced manner. When the organic compound (B) having an acidic site and the organic compound (C) having an acid anhydride site described later are used together, a total amount of these preferably falls within the above-described preferable range.

[I-3. Organic Compound (C) Having Acid Anhydride Site]

The organic compound (C) having an acid anhydride site of the resin composition of the present embodiment is a component mainly concerned in the flux activity of the resin composition. The organic compound (C) having an acid anhydride site is not especially limited as long as it is an organic compound having one or more acid anhydride sites in a molecule. The acid anhydride site is preferably a carboxylic anhydride site.

In addition, the organic compound (C) having an acid anhydride site of the resin composition of the present embodiment preferably prevents volatilization thereof before exhibiting the flux activity in the flip-chip bonding, namely, prevents volatilization of the organic compound (C) having an acid anhydride site before removing the oxidized layer of the connecting portion. From this point of view, a molecular weight of the organic compound (C) having an acid anhydride site is preferably 200 or more. On the other hand, from the viewpoint of obtaining mobility as an acid and attaining more sufficient flux activity, the molecular weight of the organic compound (C) having an acid anhydride site is preferably 8000 or less, more preferably less than 2000, further preferably 1500 or less, still further preferably 1000 or less, particularly preferably 800 or less, and extremely preferably 500 or less.

An acid anhydride site is hydrolyzed to form an acidic site, resulting in exhibiting the flux activity. Accordingly, in order to obtain more sufficient flux activity necessary for removing the oxidized layer, a water content in the resin composition is preferably controlled. When it is difficult to control the water content in the resin composition, the organic compound (B) having an acidic site is preferably used instead of the organic compound (C) having an acid anhydride site.

Specific examples of the organic compound (C) having an acid anhydride site include an acid anhydride that may have a substituent and has an acid anhydride site not forming a ring, such as propionic anhydride, hexanoic anhydride or octanoic anhydride; and an acid anhydride that may have a substituent and has an acid anhydride site forming a ring, such as succinic anhydride, phthalic anhydride, trimellitic anhydride, pyromellitic anhydride, benzophenone tetracarboxylic anhydride, ethylene glycol bistrimellitate, glycerol tristrimellitate or maleic anhydride. As the organic compound (C) having an acid anhydride site, a commercially available product may be used, and as such an organic compound (C), Ricacid TMEG-200 (product name, manufactured by New Japan Chemical Co., Ltd.) represented by the following formula (4) can be suitably used. One of these can be used singly, or two or more of these compounds can be used as an appropriate mixture.

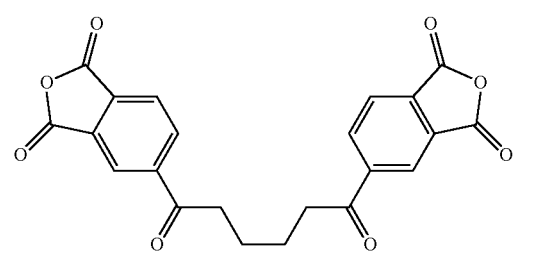

(4)

[I-4. Inorganic Filler (D)]

The resin composition of the present embodiment can contain the inorganic filler (D) in order to improve fire resistance, improve thermal conductivity and reduce a thermal expansion coefficient. When the inorganic filler is used, the fire resistance and the thermal conductivity of the resin composition and the like can be improved, and the thermal expansion coefficient thereof can be reduced. In addition, the inorganic filler (D) preferably has an electrical insulating property from the viewpoint of more sufficiently attaining an electrical insulating property between electrodes of a chip in using the resin composition of the present embodiment as a material of an underfill material, and preferably of a pre-applied underfill material. Here, the term "an electrical insulating property" means that volume resistivity at normal temperature is $10^{12}$ $\Omega \cdot cm$ or more. The type of the inorganic filler (D) is not especially limited, and examples thereof include silica (such as natural silica, fused silica, amorphous silica and hollow silica), aluminum compounds (such as boehmite, aluminum hydroxide, alumina and aluminum nitride), magnesium compounds (such as magnesium oxide and magnesium hydroxide), calcium compounds (such as calcium carbonate and calcium sulfate), molybdenum compounds (such as molybdenum oxide and zinc molybdate), boron nitride, barium sulfate, talc (such as natural talc and calcined talc), mica, and glass (such as short fibrous glass, spherical glass, and finely powdered glass (such as E-glass, T-glass and D-glass)). One of these may be used singly, or any combinations of two or more of these at any ratio may be used as the inorganic filler (D).

Among these, from the viewpoint of improving the fire resistance as well as reducing the thermal expansion coefficient of the resin composition, the inorganic filler (D) is preferably silica, aluminum hydroxide, alumina, boehmite, boron nitride, aluminum nitride, magnesium oxide or magnesium hydroxide, and more preferably silica, among which fused silica is particularly preferred. Specific examples of the fused silica include SFP-120MC, SF-130MC and the like manufactured by Denka Company Limited, and SC1050-MLQ, SC2050-MNU, SC2050-MTX, SE2053-SQ, YA050C-MJF, YA050C-MJA manufactured by Admatechs Company Limited.

An average particle size of the inorganic filler (D) is not limited, and when the resin composition of the present invention is used as an underfill material, and preferably as a pre-applied underfill material, it is preferably 3 µm or less, and more preferably 1 µm or less from the viewpoint of coping with reduction in pitch between electrodes arranged on a chip and reduction in gap between electrodes. The lower limit of the average particle size is not especially limited, and may be, for example, 10 nm. It is noted that the "average particle size" of the inorganic filler (D) herein means a median diameter of the inorganic filler (D). A median diameter here means a particle size obtained, when a particle size distribution of a powder is divided into two groups based on a given particle size, as a particle size where a volume of particles belonging to a larger size group and a volume of particles belong to a smaller size group respectively occupy 50% of the whole powder. The average particle size (the median diameter) of the inorganic filler (D) is measured by a wet laser diffraction-scattering method.

When the inorganic filler (D) is used, a content thereof in the resin composition is preferably 300 parts by mass or less, and more preferably 200 parts by mass or less based on 100 parts by mass of a total content of the maleimide compound (A), the organic compound (B) having an acidic site and the organic compound (C) having an acid anhydride site from the viewpoint of attaining flowability at the time of the bonding of the underfill material, preferably of the pre-applied under fill material, with the fire resistance of the resin composition improved and the coefficient of thermal expansion reduced. In addition, the content of the inorganic filler (D) is preferably 10 parts by mass or more, more preferably 20 parts by mass or more, and further preferably 50 parts by mass or more based on 100 parts by mass of the above-described total content. When two or more inorganic fillers (D) are used together, a total amount thereof preferably falls within the above-described range of the content.

[I-5. Flexibility-Imparting Component (E)]

The flexibility-imparting component (E) of the resin composition of the present embodiment is not especially limited as long as it is a component capable of imparting flexibility to a layer containing the resin composition, and examples thereof include thermoplastic polymer compounds such as polyimide, polyamideimide, polystyrene, polyolefin, styrene-butadiene rubber (SBR), isoprene rubber (IR), butadiene rubber (BR), acrylonitrile butadiene rubber (NBR), polyurethane, polypropylene, an acrylic oligomer, an acrylic polymer and a silicone resin. One of these may be used singly, or any combinations of two or more of these at any ratio may be used as the flexibility-imparting component (E).

Among these, the flexibility-imparting component (E) is preferably at least one selected from the group consisting of a (meth)acrylic oligomer and a (meth)acrylic polymer from the viewpoints of the solubility in an organic solvent used in producing the resin composition, compatibility with the maleimide compound, controllability of melt viscosity of the resin composition and imparting of the flexibility. Specific examples of the (meth)acrylic oligomer and the (meth)acrylic polymer include "ARUFON®" series available from Toagosei Co., Ltd., "Actflow®" series available from Soken Chemical & Engineering Co., Ltd., "PARACRON®" series available from Negami Chemical Industrial Co., Ltd., and "KURARITY®" series available from Kuraray Co., Ltd. It is noted that the term "(meth)acrylic" herein refers to a concept embracing both "acrylic" and "methacrylic".

A molecular weight of the flexibility-imparting component (E) is not limited, and from the viewpoint of imparting flexibility to the resin composition, a weight average molecular weight is preferably 1000 or more, and more preferably 2000 or more. In addition, when the resin composition is used as an underfill material, and preferably as a pre-applied underfill material, in order to prevent the resin composition from being entrapped in a metal connecting portion and to obtain bonding in a better and more stable shape, the melt viscosity of the resin composition is preferably controlled low to attain the flowability of the resin composition at the time of the bonding. From this point of view, the weight average molecular weight of the flexibility-imparting component (E) is preferably 1000000 or less, more preferably 800000 or less, further preferably 100000 or less, and still further preferably 10000 or less. When the used flexibility-imparting component (E) has a weight average molecular weight falling within this preferable range, the flexibility of the resin composition and a connecting property obtained in using the resin composition as an underfill material, and preferably as a pre-applied underfill material can be both attained in a well-balanced manner. It is noted that the "weight average molecular weight" of the flexibility-imparting component (E) herein means a weight average molecular weight in terms of polystyrene standard measured by gel permeation chromatography (GPC).

When the flexibility-imparting component (E) is used, a content thereof in the resin composition is preferably 100 parts by mass or less, more preferably 50 parts by mass or less, and further preferably 30 parts by mass or less based on 100 parts by mass of the content of the maleimide compound (A) from the viewpoint of the controllability of the melt viscosity. In addition, the content of the flexibility-imparting component (E) in the resin composition is preferably 1 part by mass or more, and more preferably 5 parts by mass or more based on 100 parts by mass of the content of the maleimide compound (A) from the viewpoint of more effectively and reliably obtaining the function effect attained by the usage of the flexibility-imparting component (E). When two or more flexibility-imparting components (E) are used together, a total amount of these preferably falls within the above-described range of the content.

[I-6. Additional Components]

The resin composition of the present embodiment may contain, in addition to the maleimide compound (A), the organic compound (B) having an acidic site, the organic compound (C) having an acid anhydride site, the inorganic filler (D) and the flexibility-imparting component (E), one, two or more additional components.

The resin composition of the present embodiment may contain, for example, a silane coupling agent for purposes of improving moisture absorption and heat resistance and improving adhesion between a chip and the resin composition. The silane coupling agent is not limited as long as it is a silane coupling agent generally used in a surface treatment of an inorganic substance, and has low reactivity with the organic compound (B) having an acidic site and the organic compound (C) having an acid anhydride site. Specific examples thereof include vinylsilane-based silane coupling agents (such as vinyltrimethoxysilane and γ-methacryloxypropyltrimethoxysilane), phenylaminosilane-based silane coupling agents (such as N-phenyl-3-aminopropyltrimethoxysilane), phenylsilane-based silane coupling agents, and imidazolesilane-based silane coupling agents. One of these silane coupling agents may be used singly, or any combinations of two or more of these at any ratio may be used.

When the silane coupling agent is used, a content thereof in the resin composition is not limited. From the viewpoints of improving the moisture absorption and heat resistance and reducing a volatilization amount at the time of the flip-chip bonding, however, the content is preferably 0.05 parts by mass or more and 20 parts by mass or less, and more preferably 0.1 parts by mass or more and 15 parts by mass or less based on 100 parts by mass of the total amount of the maleimide compound (A), the organic compound (B) having an acidic site, the organic compound (C) having an acid anhydride site, the inorganic filler (D) and the flexibility-imparting component (E). When two or more silane coupling agents are used together, a total amount of these preferably falls within the above-described range of the content.

The resin composition of the present embodiment may contain a wetting and dispersing agent for purposes of improving productivity of a laminate and improving dispersibility of the inorganic filler (D) and the like. The wetting and dispersing agent is not limited as long as it is a wetting and dispersing agent generally used in a paint or the like. Specific examples thereof include Disperbyk-110,-111,-180 and-161, and BYK-W996, -W9010 and-W903 (all product names) manufactured by BYK Japan KK. One of these wetting and dispersing agents may be used singly, or any combinations of two or more of these at any ratio may be used.

When the wetting and dispersing agent is used, a content thereof in the resin composition is not limited, and from the viewpoint of the productivity of a laminate, the content is preferably 0.1 parts by mass or more and 5 parts by mass or less, and more preferably 0.5 parts by mass or more and 3 parts by mass or less based on 100 parts by mass of the inorganic filler (D).

When the wetting and dispersing agent is used, the content thereof in the resin composition is not limited, and from the viewpoint of the productivity of a laminate, the content is preferably 0.1 parts by mass or more and 5 parts by mass or less, and more preferably 0.5 parts by mass or more and 3 parts by mass or less based on 100 parts by mass of the content of the maleimide compound (A).

When two or more wetting and dispersing agents are used together, a total amount of these preferably falls within the above-described range of the content.

The resin composition of the present embodiment may contain a curing accelerator for purposes of adjusting a cure rate and the like. The curing accelerator is not especially limited as long as it is known as a curing accelerator for a maleimide compound and is generally used. Specific examples of the curing accelerator include imidazoles and derivatives thereof (such as 2-ethyl-4-methylimidazole, 2-phenyl-4-methylimidazole, 1-benzyl-2-phenylimidazole and 2,4,5-triphenylimidazole), and tertiary amines (such as triethylamine and tributylamine). One of these curing accelerators may be used singly, or any combinations of two or more of these at any ratio may be used.

When the curing accelerator is used, a content thereof in the resin composition is not especially limited, and from the viewpoint of adjusting a cure rate, the content is preferably 0.01 parts by mass or more and 2 parts by mass or less, more preferably 0.5 parts by mass or more and 1 part by mass or less, and further preferably 0.1 parts by mass or more and 1 part by mass or less based on 100 parts by mass of the content of the maleimide compound (A). When two or more curing accelerators are used together, a total amount of these preferably falls within the above-described range of the content.

The resin composition of the present embodiment may contain various additives for various purposes as long as desired characteristics are not impaired. Examples of the additives include an ultraviolet absorber, an antioxidant, a photopolymerization initiator, a fluorescent brightener, a photosensitizer, a dye, a pigment, a thickener, a lubricant, an antifoaming agent, a leveling agent, a polish, and a flame retardant. One of these additives may be used singly, or any combinations of two or more of these at any ratio may be used. In the resin composition of the present embodiment, a content of such other additive is not especially limited, and is usually 0.1 parts by mass or more and 10 parts by mass or less based on 100 parts by mass of the content of the maleimide compound (A).

The resin composition of the present embodiment is prepared by mixing the maleimide compound (A), the organic compound (B) having an acidic site and/or the organic compound (C) having an acid anhydride site, and if necessary, the organic filler (D), the flexibility-imparting component (E) and other additional components. The composition may be in the form of a varnish obtained by dissolving or dispersing these components in an organic solvent, if necessary. Such a varnish of the resin composition of the present embodiment can be suitably used as a varnish in producing a laminate of the present embodiment described later. The organic solvent is not limited as long as it can suitably dissolve or disperse the above-described components and does not impair the desired effects of the resin composition of the present embodiment. Specific examples of the organic solvent include alcohols (such as methanol, ethanol and propanol), ketones (such as acetone, methyl ethyl ketone and methyl isobutyl ketone), amides (such as dimethylacetamide and dimethylformamide), and aromatic hydrocarbons (such as toluene and xylene). One of these organic solvents may be used singly, or any combinations of two or more of these at any ratio may be used.

The resin composition of the present embodiment is excellent in the flux activity, the flexibility and low thermal expansion. In addition, when the resin composition is applied onto a supporting material, a laminate including a resin layer excellent in the flux activity can be provided. When the resin composition of the present embodiment is used as a pre-applied underfill material to be used in the form of a laminate, suitable effects of being excellent in the flux activity, the flexibility and the low thermal expansion as well as being excellent in the connecting property, the moisture absorption and heat resistance and the adhesion to a chip can be exhibited. In this manner, the resin composition of the present embodiment has various excellent features, and in particular, the flux activity, the flexibility and the low thermal expansion can be all attained at a high level, and therefore, it is extremely useful as an underfill material, particularly as a pre-applied underfill material.

In the resin composition of the present embodiment, a wettability of a solder ball, used as an index for evaluating the flux activity by a method described in an example below, is preferably 25% or more, and more preferably 50% or more. In addition, in the resin composition of the present embodiment, a coefficient of thermal expansion measured by a method described in an example below is preferably less than 50 ppm/° C., and more preferably less than 30 ppm/° C.

[II. Laminate, Semiconductor Wafer with a Resin Composition Layer Produced by Using Laminate, Substrate with a Resin Composition Layer Produced by Using Laminate, and Semiconductor Device]

A laminate, a semiconductor wafer with a resin composition layer, a substrate with a resin composition layer, and a semiconductor device of the present embodiment are all formed by using the resin composition of the present embodiment described above.

[II-1. Laminate]

The laminate of the present embodiment includes a supporting material and a layer containing the resin composition of the present embodiment and stacked on the supporting material. In such a laminate, the resin composition of the present embodiment described above is attached to the supporting material. The supporting material is not especially limited, and a polymer film can be used. Specific examples of a material of the polymer film include a film containing at least one or more resins selected from the group consisting of polyvinyl chloride, polyvinylidene chloride, polybutene, polybutadiene, polyurethane, an ethylene-vinyl oxide copolymer, polyesters such as polyethylene terephthalate, polyethylene naphthalate and polybutylene terephthalate, polyethylene, polypropylene, an ethylene-propylene copolymer, polymethyl pentene, polyimide and polyamide, and a release film obtained by applying a release agent to a surface of any of these films. Among these, polyester, polyimide and polyamide are preferred, among which polyethylene terephthalate, that is, a kind of polyester, is particularly preferred.

A thickness of the supporting material of the present embodiment is not limited, and from the viewpoint of the productivity of the laminate, such as stability in application thickness in applying the resin composition onto the supporting material, the thickness is preferably 10 μm or more and 100 μm or less. In addition, also from the viewpoint of transportability of the resin laminate, the thickness is preferably 10 μm or more and 100 μm or less. Furthermore, the lower limit of the thickness is more preferably 12 μm or more, further preferably 25 μm or more, and particularly preferably 30 μm or more from the viewpoint of securing a yield in producing the laminate. In addition, the upper limit of the thickness is more preferably 50 μm or less from the viewpoint of production cost of the laminate because the supporting material is not present finally as a composing member of a semiconductor device but is peeled off during the process.

A method for producing the laminate of the present embodiment by forming, on the above-described supporting material, a layer containing the resin composition of the present embodiment (hereinafter also simply referred to as the "resin composition layer") is not limited. As the production method, for example, a varnish obtained by dissolving or dispersing the resin composition of the present embodiment in an organic solvent is applied to a surface of the supporting material, the resultant is heated and/or dried under reduced pressure so as to cure the resin composition of the present embodiment with the solvent removed, and thus, the resin composition layer is formed. Conditions for drying are not especially limited, and the drying is performed with a content ratio of the organic solvent in the resin composition layer set to usually 10% by mass or less, and preferably 5% by mass or less based on a total amount (100% by mass) of the resin composition layer. The conditions for performing such drying vary depending on the type and the content of the organic solvent in the varnish. For example, when a varnish contains 30 parts by mass or more and 60 parts by mass or less of methyl ethyl ketone based on 100 parts by mass of a total content of the maleimide compound (A), the organic compound (B) having an acidic site and/or the organic compound (C) having an acid anhydride site in the resin composition containing these, the drying is performed under 1 atm. with heating at 90° C. or more and 160° C. or less for about 3 minutes or more and 10 minutes or less for reference. A thickness of the resin composition layer in the laminate of the present embodiment is not limited, and is preferably in a range of 5 μm or more and 500 μm or less, and more preferably in a range of 10 μm or more and 100 μm or less from the viewpoint of more satisfactorily removing a light volatile component at the time of the drying of the resin composition layer and from the viewpoint of more effectively and reliably attaining the function as the laminate.

[II-2. Semiconductor Wafer with a Resin Composition Layer Produced by Using Laminate, and Substrate with a Resin Composition Layer Produced by Using Resin Laminate]

The semiconductor wafer with a resin composition layer of the present embodiment includes a semiconductor wafer, and the resin composition layer of the above-described laminate stacked on the semiconductor wafer, and is formed from the laminate of the present embodiment described above and a semiconductor wafer. The substrate with a resin composition layer of the present embodiment includes a substrate, and the resin composition layer of the above-described laminate stacked on the substrate, and is formed from the laminate of the present embodiment described above and a substrate.

A method for producing the semiconductor wafer with a resin composition layer of the present embodiment is not limited, and for example, the semiconductor wafer with a resin composition layer is obtained by bonding a surface of a semiconductor wafer having electrodes formed thereon, namely, a surface to be bonded to a substrate, to oppose the resin composition layer of the laminate of the present embodiment. In addition, a method for producing the substrate with a resin composition layer of the present embodiment is not limited, and for example, the substrate with a resin composition layer is obtained by bonding a surface of a substrate for mounting a chip thereon to oppose the resin composition layer of the laminate of the present embodiment.

A method for bonding the laminate of the present embodiment to a semiconductor wafer or a substrate is not especially limited, and a vacuum pressure laminator can be suitably used. In this case, a bonding method in which a pressure is applied to the laminate of the present embodiment through an elastic body of rubber or the like is preferably employed. Conditions for laminating are not especially limited as long as they are conditions generally employed in the art, and for example, the bonding is performed at a temperature of 50° C. or more and 140° C. or less under a contact pressure in a range of 1 kgf/cm² or more and 11 kgf/cm² or less and an environment of reduced pressure of 20 hPa or less. After the laminating step, the bonded laminate may be flattened by hot pressing using a metal plate. The laminating step and the flattening step can be continuously performed using a commercially available vacuum pressure laminator. In either case, the supporting material is removed from the laminate bonded to the semiconductor wafer or the substrate before performing the flip-chip bonding of a chip.

[II-3. Semiconductor Device]

The semiconductor device of the present embodiment includes the semiconductor wafer with a resin composition layer of the present embodiment and/or the substrate with a resin composition layer of the present embodiment, and is constructed from the resin composition layer of the present embodiment, a chip, a substrate and the like. A method for producing the semiconductor device of the present embodiment is not limited, and for example, the semiconductor wafer with a resin composition layer of the present embodiment is thinned by grinding or the like and then diced using a dicing saw or the like to obtain a chip with a resin composition layer, and the thus obtained chip is mounted on a substrate. In addition, the chip may be mounted on the substrate with a resin composition layer of the present embodiment. In a method for mounting the chip with a resin composition layer on a substrate and a method for mounting a semiconductor chip on the substrate with a resin composition layer, a flip chip bonder compliant with thermocompression bonding can be suitably used. In addition, although the flip-chip bonding of a chip onto a substrate is described for convenience sake in the present embodiment, the resin composition of the present embodiment can be applied to a target different from a substrate while performing the flip-chip bonding to a chip. For example, the resin composition of the present embodiment can be used in a connecting portion between a semiconductor wafer and a chip in mounting the chip on the semiconductor wafer, or in a connecting portion between chips of chip laminates used in connecting the chips through a TSV (through silicon via) or the like, and in either case, advantages of the present invention can be obtained.

EXAMPLES

The present invention will be hereinafter described in detail with reference to Examples and Comparative Examples, and it is to be noted that the present invention is not limited to these Examples.

1. Preparation of Resin Composition and Resin Laminate

Example 1

A varnish was obtained by mixing and stirring with a high-speed mixer for 30 minutes the following: 160 parts by mass (corresponding to 80 parts by mass in terms of a non-volatile content) of a methyl ethyl ketone (hereinafter sometimes abbreviated as "MEK") solution (having a non-volatile content of 50% by mass) of a maleimide compound of formula (1) in which $R^1$ all represents a hydrogen atom and $n^1$ represents 1 to 3 (product name "BMI-2300", manufactured by Daiwa Fine Chemicals Co., Ltd.) used as a first maleimide compound (A); 40 parts by mass (corresponding to 20 parts by mass in terms of a non-volatile content) of an MEK solution (having a non-volatile content of 50% by mass) of a maleimide compound represented by formula (2) (product name "BMI-1000P", manufactured by K•I Chemical Industry Co., Ltd., in which $n^2$ represents a value of 14 on average) used as a second maleimide compound (A); 40 parts by mass (corresponding to 20 parts by mass in terms of a non-volatile content) of an MEK solution (having a non-volatile content of 50% by mass) of dehydroabietic acid (manufactured by Wako Pure Chemical Industries Ltd., molecular weight: 300.44, functional group equivalent of acidic site: 300 g/eq.) used as an organic compound (B) having an acidic site; and 0.1 parts by mass (corresponding to 0.01 parts by mass in terms of a non-volatile content) of an MEK solution (having a non-volatile content of 10% by mass) of 2-phenyl-4-methylimidazole (product name "2P4MZ", manufactured by Shikoku Chemicals Corporation) used as a curing accelerator. The thus obtained varnish was applied onto a polyethylene terephthalate film (TR1-38, manufactured by Unitika Ltd.) having a thickness of 38 μm and having a surface coated with a release agent, and the resultant was dried by heating at 100° C. for 5 minutes to obtain a laminate including a resin composition layer of the present invention having a thickness of 30 μm. Here, a content of the organic compound (B) having an acidic site was 20% by mass based on 100% by mass of the maleimide compounds (A).

Example 2

A varnish was prepared in the same manner as in Example 1 except that the use amounts of the maleimide compounds (A) of the MEK solution (having a non-volatile content of 50% by mass) of the maleimide compound (BMI-2300) of formula (1) in which $R^1$ all represents a hydrogen atom and $n^1$ represents 1 to 3 was changed from 160 parts by mass (corresponding to 80 parts by mass in terms of a non-volatile content) to 120 parts by mass (corresponding to 60 parts by mass in terms of a non-volatile content), and of the MEK solution (having a non-volatile content of 50% by mass) of the maleimide compound (BMI-1000P) represented by formula (2) was changed from 40 parts by mass (corresponding to 20 parts by mass in terms of a non-volatile content) to 80 parts by mass (corresponding to 40 parts by mass in terms of a non-volatile content), and a laminate was obtained. Here, the content of the organic compound (B) having an acidic site was 20% by mass based on 100% by mass of the maleimide compounds (A).

Example 3

A varnish was prepared in the same manner as in Example 2 except that 166.7 parts by mass (corresponding to 100 parts by mass in terms of a non-volatile content) of slurry silica (product name "SC1050-MLQ", manufactured by Admatechs Company Limited; average particle size: 0.3 μm, non-volatile content: 60% by mass) was further added as an inorganic filler (D) to the varnish, and a laminate was obtained. Here, the content of the organic compound (B) having an acidic site was 20 parts by mass based on 100 parts by mass of the maleimide compounds (A), and the content of the inorganic filler (D) was 83.3% by mass based on 100% by mass of a total content of the maleimide compounds (A) and the organic compound (B) having an acidic site.

Example 4

A varnish was prepared in the same manner as in Example 1 except that 166.7 parts by mass (corresponding to 100 parts by mass in terms of a non-volatile content) of slurry silica (product name "SC1050-MLQ", manufactured by Admatechs Company Limited; average particle size: 0.3 μm, non-volatile content: 60% by mass) was further added as an inorganic filler (D) to the varnish, and that 10 parts by mass of an acrylic polymer (product name "US-6170", manufactured by Toagosei Co., Ltd.) was further added as a flexibility-imparting component (E) to the varnish, and a laminate was obtained. Here, the content of the organic compound (B) having an acidic site was 20 parts by mass based on 100 parts by mass of the maleimide compounds (A), and the content of the inorganic filler (D) was 83.3% by mass based on 100% by mass of a total content of the maleimide compounds (A) and the organic compound (B) having an acidic site.

Example 5

A varnish was prepared in the same manner as in Example 4 except that the use amounts of the maleimide compounds (A) of the MEK solution (having a non-volatile content of 50% by mass) of the maleimide compound (BMI-2300) of formula (1) in which $R^1$ all represents a hydrogen atom and $n^1$ represents 1 to 3 was changed from 160 parts by mass (corresponding to 80 parts by mass in terms of a non-volatile content) to 40 parts by mass (corresponding to 20 parts by mass in terms of a non-volatile content), and of the MEK solution (having a non-volatile content of 50% by mass) of the maleimide compound (BMI-1000P) represented by formula (2) was changed from 40 parts by mass (corresponding to 20 parts by mass in terms of a non-volatile content) to 40 parts by mass (corresponding to 20 parts by mass in terms of a non-volatile content), that 60 parts by mass (corresponding to 30 parts by mass in terms of a non-volatile content) of an MEK solution (having a non-volatile content of 50% by mass) of bis-(3-ethyl-5-methyl-4-maleimidophenyl)methane (product name "BMI-70", manufactured by K•I Chemical Industry Co., Ltd.) was further added as a third maleimide compound to the varnish, and that 60 parts by mass (corresponding to 30% by mass in terms of a non-volatile content) of an MEK solution (having a non-volatile content of 50% by mass) of 2,2-bis{4-(4-maleimidophenoxy)phenyl}propane (product name "BMI-80", manufactured by K•I Chemical Industry Co., Ltd.) was further added as a fourth maleimide compound to the varnish, and a laminate was obtained. Here, the content of the organic compound (B) having an acidic site was 20% by mass based on 100% by mass of the maleimide compounds (A), and the content of the inorganic filler (D) was 83.3% by mass based on 100% by mass of the total content of the maleimide compounds (A) and the organic compound (B) having an acidic site.

Example 6

A varnish was prepared in the same manner as in Example 1 except that 40 parts by mass (corresponding to 20 parts by mass in terms of a non-volatile content) of an MEK solution (having a non-volatile content of 50% by mass) of abietic acid (manufactured by Tokyo Chemical Industry Co., Ltd.; molecular weight: 302.46, functional group equivalent of acidic site: 300 g/eq.) was used as the organic compound (B) having an acidic site instead of 40 parts by mass of the MEK solution of dehydroabietic acid, and a laminate was obtained. Here, the content of the organic compound (B) having an acidic site was 20% by mass based on 100% by mass of the maleimide compounds (A).

Example 7

A varnish was prepared in the same manner as in Example 1 except that 40 parts by mass (corresponding to 20 parts by mass in terms of a non-volatile content) of an MEK solution (having a non-volatile content of 50% by mass) of dihydroabietic acid (manufactured by Wako Pure Chemical Industries Ltd.; molecular weight: 304.47, functional group equivalent of acidic site: 300 g/eq.) was used as the organic compound (B) having an acidic site instead of 40 parts by mass of the MEK solution of dehydroabietic acid, and a laminate was obtained. Here, the content of the organic compound (B) having an acidic site was 20% by mass based on 100% by mass of the maleimide compounds (A).

Example 8

A varnish was prepared in the same manner as in Example 1 except that the organic compound (B) having an acidic site of the MEK solution of dehydroabietic acid was not used, and that 40 parts by mass (corresponding to 20 parts by mass in terms of a non-volatile content) of an MEK solution (having a non-volatile content of 50% by mass) of Ricacid TMEG-200 (manufactured by New Japan Chemical Co., Ltd.; molecular weight: 410.29, functional group equivalent of acid anhydride site: 205 g/eq.) represented by formula (4) was used as an organic compound (C) having an acid anhydride site, and a laminate was obtained. Here, the content of the compound (C) having an acid anhydride site was 20% by mass based on 100% by mass of the maleimide compounds (A).

Example 9

A varnish was prepared in the same manner as in Example 5 except that 40 parts by mass (corresponding to 20 parts by mass in terms of a non-volatile content) of an MEK solution (having a non-volatile content of 50% by mass) of an acid-modified rosin resin (product name "Malkyd No. 32" manufactured by Arakawa Chemical Industries, Ltd.; weight average molecular weight: 2000, functional group equivalent of acidic site: 414 g/eq.) was used as the organic compound (B) having an acidic site instead of 40 parts by mass of the MEK solution of dehydroabietic acid, and a laminate was obtained. Here, the content of the organic compound (B) having an acidic site was 20% by mass based on 100% by mass of the maleimide compounds (A), and the content of the inorganic filler (D) was 83.3% by mass based on 100% by mass of the total content of the maleimide compounds (A) and the organic compound (B) having an acidic site.

Comparative Example 1

A varnish was prepared in the same manner as in Example 2 except that the organic compound (B) having an acidic site of the MEK solution of dehydroabietic acid was not used, and a laminate was obtained.

Comparative Example 2

A varnish was prepared in the same manner as in Example 1 except that the maleimide compounds (A) of the MEK solution of the maleimide compound (product name "BMI- 2300", manufactured by Daiwa Fine Chemicals Co., Ltd.) of formula (1) in which $R^1$ all represents a hydrogen atom and $n^1$ represents 1 to 3 and the MEK solution of the maleimide compound (BMI-1000P) represented by formula (2) were not used. The thus obtained varnish was applied onto a polyethylene terephthalate film having a thickness of 38 μm and having a surface coated with a release agent, and the resultant was dried by heating at 100° C. for 5 minutes, but no resin composition layer was formed, and thus a laminate could not be obtained.

Comparative Example 3

A varnish was obtained by mixing and stirring with a high-speed mixer for 30 minutes the following: 124 parts by mass (corresponding to 62 parts by mass in terms of a non-volatile content) of an MEK solution (having a non-volatile content of 50% by mass) of a bisphenol A-based epoxy compound (product name "EXA-850CRP", epoxy group equivalent: 171 g/eq., manufactured by DIC Corporation); 76 parts by mass (corresponding to 38 parts by mass in terms of a non-volatile content) of an MEK solution (having a non-volatile content of 50% by mass) of a novolac-type phenol compound (product name "Phenolite KA-1163", hydroxyl group equivalent: 118 g/eq., manufactured by DIC Corporation); 40 parts by mass (corresponding to 20 parts by mass in terms of a non-volatile content) of an MEK solution (having a non-volatile content of 50% by mass) of dehydroabietic acid used as an organic compound (B) having an acidic site; and 0.1 parts by mass (corresponding to 0.01 parts by mass in terms of a non-volatile content) of an MEK solution (having a non-volatile content of 10% by mass) of 2-phenyl-4-methylimidazole (product name "2P4MZ") used as a curing accelerator. The thus obtained varnish was applied onto a polyethylene terephthalate film (TR1-38) having a thickness of 38 μm and having a surface coated with a release agent, and the resultant was dried by heating at 100° C. for 5 minutes to obtain a laminate.

2. Evaluation of Resin Composition (1) Flux Activity

The varnish obtained in each of Examples 1 to 9 and Comparative Examples 1 to 3 was applied onto a glossy surface of an electrolytic copper foil (product name "3EC-III", manufactured by Mitsui Mining & Smelting Co., Ltd.) having a thickness of 12 μm, and the resultant was dried at 100° C. for 5 minutes to obtain a copper foil with a resin composition layer. A solder ball (product name "Ecosolder ball M705", Sn-3.0 Ag-0.5 Cu alloy, manufactured by Senju Metal Industry Co., Ltd.) having a diameter of 0.5 mm was placed on the copper foil with a resin composition, and an electrolytic copper foil (3EC-III) having a thickness of 12 μm was further placed thereon with the glossy surfaces opposing each other. The resultant was placed on a hot plate heated to 235° C. to melt the solder on the copper foil, and the flux activity was evaluated based on a wettability of the solder ball on the copper foil. The wettability of the solder ball was calculated based on a height (a) of the solder ball before heating and a height (b) of the solder ball after heating in accordance with the following expression:

Wettability of Solder Ball={$(a)-(b)$}/$(a)\times100$

In addition, one having a wettability of the solder ball of 50% or more was evaluated as "A", one having a wettability of 25% or more and less than 50% was evaluated as "B", and one having a wettability less than 25% was evaluated as "C". The results are shown in Table 1.

(2) Flexibility

The laminate obtained in each of Examples 1 to 9 and Comparative Examples 1 and 3 was cut into a shape of a strip having a size of 5 cm×10 cm, and the resultant was wound, at room temperature, around a metal tube having an outer diameter of 3 cm with the polyethylene terephthalate film of the supporting material disposed inside, held in this state for 5 seconds, and then unwound. This operation was performed repeatedly ten times, and it was checked whether or not the resin composition layer of the present invention had a crack for evaluating the flexibility. One in which no cracks occurred was evaluated as "A", one in which a few cracks occurred but the cracks probably did not affect the quality in actual use was evaluated as "B", and one in which cracks occurred to an extent unacceptable for actual use was evaluated as "C". The results are shown in Table 1.

(3) Coefficient of Thermal Expansion (CTE):

Two laminates obtained in each of Examples 1 to 9 and Comparative Examples 1 and 3 were prepared, and these were bonded to each other using a vacuum pressure laminator with the resin composition layers thereof opposing each other. After peeling off the polyethylene terephthalate film of the supporting material, the resultant was heated at 220° C. for 4 hours to obtain a measurement sample having a thickness of about 60 μm. The measurement sample was set in a prescribed position of a thermomechanical analyzer (Model "Q400" manufactured by TA Instruments), and a coefficient of thermal expansion in a range from 60° C. to 120° C. of the sample was measured with the temperature increased from 25° C. to 250° C. at 10° C./min. One having a coefficient of thermal expansion less than 30 ppm/° C. was evaluated as "A", one having a coefficient of thermal expansion of 30 ppm/° C. or more and less than 50 ppm/° C. was evaluated as "B", and one having a coefficient of thermal expansion of 50 ppm/° C. or more was evaluated as "C". The results are shown in Table 1.

TABLE 1

|  | Example | | | | | | | | | Comparative Example | | |
| --- | --- | --- | --- | --- | --- | --- | --- | --- | --- | --- | --- | --- |
|  | 1 | 2 | 3 | 4 | 5 | 6 | 7 | 8 | 9 | 1 | 2 | 3 |
| Flux Activity | A | A | B | B | B | B | B | B | B | C | A | C |
| Flexibility | B | A | B | A | A | B | B | B | A | A | Laminate cannot be produced | A |
| Coefficient of Thermal Expansion | B | B | A | A | A | B | B | B | A | B | Laminate cannot be produced | B |

As shown in Table 1, it is understood that Examples 1 to 9 each using the resin composition of the present invention are excellent in the flux activity as compared with Comparative Examples 1 and 3. In addition, although Comparative Example 2 is excellent in the flux activity, it is poor in the flexibility and thus is difficult to be produced into a laminate.

The present application is based upon the prior Japanese patent application filed on May 31, 2016 (Japanese Patent Application No. 2016-108170) and Japanese patent application filed on Jul. 14, 2016 (Japanese Patent Application No. 2016-139704), entire contents of which are incorporated herein by reference.

INDUSTRIAL APPLICABILITY

A resin composition of the present invention exhibits various effects of being excellent in the flux activity, the flexibility and the low thermal expansion as described above, and thus is useful as an underfill material, and preferably as a pre-applied underfill material. Since the resin composition of the present invention is particularly excellent in the flux activity, it is extremely useful because a good bonding state can be obtained in bonding a chip and a substrate, bonding a chip and a semiconductor wafer, or bonding a chip and another chip. Accordingly, the resin composition of the present invention is industrially applicable in fields where such curing is required.

The invention claimed is:

1. A resin composition for an underfill material, comprising a maleimide compound (A), and at least one selected from the group consisting of an organic compound (B) having an acidic site and an organic compound (C) having an acid anhydride site, wherein the maleimide compound (A) comprises at least one selected from the group consisting of a maleimide compound represented by the following formula (1), a maleimide compound represented by the following formula (2), and a maleimide compound represented by the following formula (3):

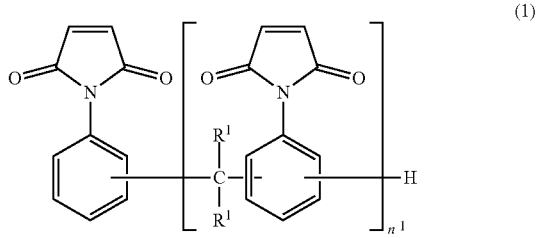
(1)

wherein $R^1$ each independently represents a hydrogen atom or a methyl group, and $n^1$ represents an integer of 1 or more;

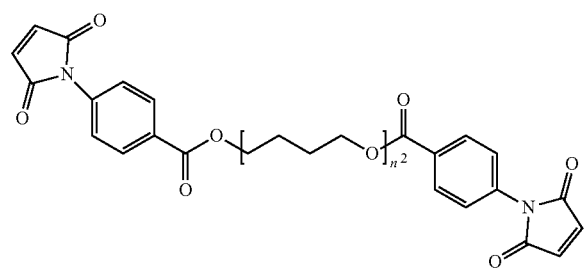
(2)

wherein $n^2$ represents a value of 1 or more and 30 or less on average;

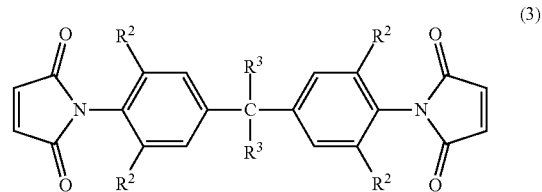
(3)

wherein $R^2$ each independently represents a hydrogen atom, a methyl group or an ethyl group, and $R^3$ each independently represents a hydrogen atom or a methyl group.

2. The resin composition according to claim 1, wherein the maleimide compound (A) comprises at least one selected from the group consisting of 2,2-bis{4-(4-maleimidophenoxy)phenyl}propane, 1,2-bis(maleimido)ethane, 1,4-bis(maleimido)butane, 1,6-bis(maleimido)hexane, N,N'-1,3-phenylenedimaleimide, N,N'-1,4-phenylenedimaleimide, and N-phenylmaleimide.

3. The resin composition according to claim 1, wherein the maleimide compound (A) comprises 2,2-bis{4-(4-maleimidophenoxy)phenyl}propane.

4. The resin composition according to claim 1, wherein a content, in the resin composition, of the organic compound (B) having an acidic site and the organic compound (C) having an acid anhydride site is 5 parts by mass or more and 50 parts by mass or less based on 100 parts by mass of a content of the maleimide compound (A).

5. The resin composition according to claim 1, wherein the organic compound (B) having an acidic site has at least one functional group selected from the group consisting of a phosphate group, a carboxyl group and a sulfonate group.

6. The resin composition according to claim 1, wherein the organic compound (B) having an acidic site has a molecular weight of 200 or more and 8000 or less.

7. The resin composition according to claim 1, wherein the organic compound (B) having an acidic site comprises at least one selected from the group consisting of abietic acid, neoabietic acid, dehydroabietic acid, pimaric acid, isopimaric acid, palustric acid, dihydroabietic acid, tetrahydroabietic acid and an acid-modified rosin resin.

8. The resin composition according to claim 7, wherein the organic compound (B) having an acidic site contains at least one selected from the group consisting of dehydroabietic acid, tetrahydroabietic acid and a rosin acid modified resin.

9. The resin composition according to claim 1, wherein an acid anhydride site of the organic compound (C) having an acid anhydride site is a carboxylic anhydride site.

10. The resin composition according to claim 1, further comprising an inorganic filler (D).

11. The resin composition according to claim 10, wherein the inorganic filler (D) has an electrical insulating property.

12. The resin composition according to claim 10, wherein the inorganic filler (D) comprises at least one selected from the group consisting of silica, aluminum hydroxide, alumina, boehmite, boron nitride, aluminum nitride, magnesium oxide and magnesium hydroxide.

13. The resin composition according to claim 10, wherein the inorganic filler (D) has an average particle size of 3 μm or less.

14. The resin composition according to claim 10, wherein a content of the inorganic filler (D) is 300 parts by mass or less based on 100 parts by mass of a total content of the maleimide compound (A), the organic compound (B) having an acidic site and the organic compound (C) having an acid anhydride site.

15. The resin composition according to claim 1, further comprising a flexibility-imparting component (E).

16. The resin composition according to claim 15, wherein the flexibility-imparting component (E) comprises a thermoplastic polymer compound, and the polymer compound has a weight average molecular weight of 1000 or more and 1000000 or less.

17. The resin composition according to claim 15, wherein the flexibility-imparting component (E) comprises at least one selected from the group consisting of a (meth)acrylic oligomer and a (meth)acrylic polymer.

18. The resin composition according to claim 1, for use in a pre-applied underfill material.

19. A laminate, comprising: a supporting material; and a layer comprising the resin composition according to claim 1.

20. A semiconductor wafer with a resin composition layer, comprising: a semiconductor wafer; and the layer comprising the resin composition of the laminate according to claim 19 stacked on the semiconductor wafer.

21. A substrate for mounting a semiconductor with a resin composition layer, comprising: a substrate for mounting a semiconductor; and the layer comprising the resin composition of the laminate according to claim 19 stacked on the substrate for mounting the semiconductor.

22. A semiconductor device, comprising: the semiconductor wafer with a resin composition layer according to claim 19.

* * * * *